(12) United States Patent
Lu et al.

(10) Patent No.: US 12,277,907 B2
(45) Date of Patent: Apr. 15, 2025

(54) PIXEL DRIVING CIRCUIT AND DISPLAY PANEL

(71) Applicant: BOE TECHNOLOGY GROUP CO., LTD., Beijing (CN)

(72) Inventors: Jiangnan Lu, Beijing (CN); Libin Liu, Beijing (CN); Zhenzhen Shan, Beijing (CN); Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/274,958

(22) PCT Filed: Jul. 1, 2022

(86) PCT No.: PCT/CN2022/103403
§ 371 (c)(1),
(2) Date: Jul. 28, 2023

(87) PCT Pub. No.: WO2023/016138
PCT Pub. Date: Feb. 16, 2023

(65) Prior Publication Data
US 2024/0144884 A1    May 2, 2024

(30) Foreign Application Priority Data
Aug. 5, 2021 (CN) .......................... 202110898500.1

(51) Int. Cl.
*G09G 3/32* (2016.01)
*G09G 3/3225* (2016.01)
(Continued)

(52) U.S. Cl.
CPC ......... *G09G 3/3258* (2013.01); *G09G 3/3225* (2013.01); *H10K 59/1213* (2023.02);
(Continued)

(58) Field of Classification Search
CPC ............... G09G 3/3258; G09G 3/3225; G09G 2300/0452; G09G 2300/0819;
(Continued)

(56) References Cited

U.S. PATENT DOCUMENTS 5,621,426 A * 4/1997 Okada .................. G09G 3/3696
345/98
11,049,458 B1    6/2021 Fan et al.
(Continued)

FOREIGN PATENT DOCUMENTS

CN         103886838 A      6/2014
CN         104157240 A     11/2014
(Continued)

OTHER PUBLICATIONS

China Patent Office, Decision of rejection issued Jun. 24, 2022 for application No. CN202110898500.1.
(Continued)

*Primary Examiner* — Towfiq Elahi
(74) *Attorney, Agent, or Firm* — HOUTTEMAN LAW LLC

(57) ABSTRACT

Provided are a pixel driving circuit and a display panel. The pixel driving circuit includes: a data writing sub-circuit, a threshold compensation sub-circuit, a driving sub-circuit, a storage sub-circuit, a first reset sub-circuit, a second reset sub-circuit. The driving sub-circuit and the storage sub-circuit are connected at a first node; the data writing sub-circuit and the storage sub-circuit are connected at a second node; the first reset sub-circuit includes a first transistor having a control electrode connected with a first reset signal line, a first electrode connected with a first initialization signal line, and a second electrode connected with the first node; the threshold compensation sub-circuit includes a second transistor having a first electrode connected with the
(Continued)

first node, a second electrode connected with the second node, and a control electrode connected with a second scan line; the first transistor and/or the second transistor includes an oxide thin film transistor.

16 Claims, 5 Drawing Sheets

(51) Int. Cl.
  *G09G 3/3258* (2016.01)
  *H10K 59/121* (2023.01)
(52) U.S. Cl.
  CPC .............. *G09G 2300/0452* (2013.01); *G09G 2300/0819* (2013.01); *G09G 2300/0842* (2013.01); *G09G 2300/0852* (2013.01); *G09G 2310/062* (2013.01); *G09G 2310/08* (2013.01); *G09G 2320/0233* (2013.01); *G09G 2320/0247* (2013.01); *G09G 2320/045* (2013.01); *G09G 2330/021* (2013.01)
(58) Field of Classification Search
  CPC ... G09G 2300/0842; G09G 2300/0852; G09G 2310/062; G09G 2310/08; G09G 2320/0233; G09G 2320/0247; G09G 2320/045; G09G 2330/021; G09G 3/32; G09G 2300/0417; G09G 2300/0861; G09G 2310/0251; G09G 2310/0262; G09G 2320/0214; G09G 2320/0219; G09G 2320/0238; G09G 2320/0257; G09G 2320/043; G09G 3/3233; G09G 3/3677; G09G 3/3696; H10K 59/1213
  See application file for complete search history.

(56) References Cited

U.S. PATENT DOCUMENTS

| | | | |
|---|---|---|---|
| 2009/0251452 A1* | 10/2009 | Kang | ................... G09G 3/3233 345/82 |
| 2018/0130424 A1 | 5/2018 | Gao et al. | |
| 2019/0385522 A1 | 12/2019 | Song et al. | |
| 2020/0005708 A1 | 1/2020 | Hwang et al. | |
| 2021/0104196 A1 | 4/2021 | Yuan | |
| 2021/0183303 A1 | 6/2021 | Kim et al. | |
| 2021/0225282 A1 | 7/2021 | Cho et al. | |

FOREIGN PATENT DOCUMENTS

| | | | | |
|---|---|---|---|---|
| CN | 105321462 A | 2/2016 | | |
| CN | 105390551 A | 3/2016 | | |
| CN | 106097964 A | 11/2016 | | |
| CN | 205722744 U | 11/2016 | | |
| CN | 106847169 A | 6/2017 | | |
| CN | 109887464 A | 6/2019 | | |
| CN | 110223636 A | 9/2019 | | |
| CN | 110660360 A | 1/2020 | | |
| CN | 111435586 A | 7/2020 | | |
| CN | 111696484 A | 9/2020 | | |
| CN | 111710299 A | 9/2020 | | |
| CN | 111710303 A | 9/2020 | | |
| CN | 111724745 A | 9/2020 | | |
| CN | 111754938 A | 10/2020 | | |
| CN | 112201208 A | 1/2021 | | |
| CN | 112233616 A | 1/2021 | | |
| CN | 112309332 A | 2/2021 | | |
| CN | 112419982 A | 2/2021 | | |
| CN | 112863428 A | 5/2021 | | |
| CN | 112992049 A | 6/2021 | | |
| CN | 113097247 A | 7/2021 | | |
| CN | 113362769 A | 9/2021 | | |
| CN | 113851083 A | 12/2021 | | |
| EP | 4300474 A1 | 1/2024 | | |
| KR | 20130030879 A | 3/2013 | | |
| KR | 20130055450 A | * | 5/2013 | ........... G09G 3/3225 |
| WO | 2019159651 A1 | 8/2019 | | |

OTHER PUBLICATIONS

China Patent Office, First Office Action issued Feb. 15, 2022 for application No. CN202110898500.1.
China Patent Office, Second Office Action issued Mar. 31, 2022 for application No. CN202110898500.1.
China Patent Office, First Office Action issued Jul. 8, 2022 for application No. CN202180002057.3.
China Patent Office, International Search Report issued Mar. 30, 2022 for application No. PCT/CN2021/109889.
European Patent Office, Extended Search Report, Jan. 29, 2024, App. No. EP21951402.3.
USPTO, First Office Action, Jun. 11, 2024, U.S. Appl. No. 17/788,725.

* cited by examiner

PIXEL DRIVING CIRCUIT AND DISPLAY PANEL

TECHNICAL FIELD

The present disclosure relates to the field of display technology, and particularly relates to a pixel driving circuit and a display panel.

BACKGROUND

The application of Active Matrix Organic Light Emitting Diode (AMOLED) display panels is becoming more and more widespread. The pixel display device of the AMOLED display panel is an Organic Light-Emitting Diode (OLED), and the AMOLED can emit light by driving a thin film transistor to generate a driving current in a saturated state, and the driving current drives the light-emitting device to emit light.

SUMMARY

The present disclosure is directed to at least one of the technical problems in the related art, and provides a pixel driving circuit and a display panel.

In a first aspect, an embodiment of the present disclosure provides a pixel driving circuit, which includes: a data writing sub-circuit, the threshold compensation sub-circuit, a driving sub-circuit, the storage sub-circuit, a first reset sub-circuit and a second reset sub-circuit; a connection node between the driving sub-circuit and a second terminal of the storage sub-circuit is a first node; a connection node between the data writing sub-circuit and a first terminal of the storage sub-circuit is a second node; a connection node between the driving sub-circuit and the threshold compensation sub-circuit is a third node;

the first reset sub-circuit includes a first transistor, a control electrode of the first transistor is connected with a first reset signal line, a first electrode of the first transistor is connected with a first initialization signal line, and a second electrode of the first transistor is connected with the first node;

the second reset sub-circuit is configured to reset a potential of the second node by a reference voltage under control of a second reset signal;

the data writing sub-circuit is configured to transmit, in response to a first scan signal, a data voltage to the second node to store the data voltage in the storage sub-circuit;

the threshold compensation sub-circuit includes a second transistor, a first electrode of the second transistor is connected with the first node, a second electrode of the second transistor is connected with the second node, and a control electrode of the second transistor is connected with a second scan line;

the driving sub-circuit is configured to provide a driving current for a light emitting device to be driven according to potentials of the first node and the third node;

the storage sub-circuit is configured to store the data voltage;

at least one of the first transistor or the second transistor includes an oxide thin film transistor.

In some implementations, the pixel driving circuit further includes: a first light emission control sub-circuit and a second light emission control sub-circuit, the first light emission control sub-circuit is configured to transmit the driving current generated by the driving sub-circuit to the light emitting device to be driven under control of a first light emission control signal; and the second light emission control sub-circuit is configured to transmit the reference voltage to the second node under control of a second light emission control signal.

In some implementations, the first light emission control sub-circuit includes a sixth transistor, and the second light emission control sub-circuit includes a seventh transistor;

a first electrode of the sixth transistor is connected with the third node, a second electrode of the sixth transistor is connected with the light emitting device to be driven, and a control electrode of the sixth transistor is connected with a first light emission control line; and a first electrode of the seventh transistor is connected with a reference voltage line, a second electrode of the seventh transistor is connected with the second node, and a control electrode of the seventh transistor is connected with a second light emission control line.

In some implementations, switching characteristics of the sixth transistor and the seventh transistor are the same and are contrary to a switching characteristic of the first transistor.

In some implementations, the pixel driving circuit further includes a third reset sub-circuit, where the third reset sub-circuit is configured to initialize the light emitting device to be driven by a second initialization signal under control of a third reset signal.

In some implementations, the third reset sub-circuit includes an eighth transistor, a first electrode of the eighth transistor is connected with a first electrode of the light-emitting device to be driven, a second electrode of the eighth transistor is connected with a second initialization signal line, and a control electrode of the eighth transistor is connected with a third reset signal line.

In some implementations, the eighth transistor has a switching characteristic contrary to that of the sixth transistor, and the first light emission control line is common to the third reset signal line.

In some implementations, the eighth transistor includes an oxide thin film transistor.

In some implementations, the driving sub-circuit includes a third transistor;

a first electrode of the third transistor is connected to a first power terminal, a second electrode of the third transistor is connected to the third node, and a control electrode of the third transistor is connected to the first node.

In some implementations, the third transistor has a switching characteristic contrary to that of the first transistor.

In some implementations, the data writing sub-circuit includes a fourth transistor;

a first electrode of the fourth transistor is connected with a data line, a second electrode of the fourth transistor is connected with the second node, and a control electrode of the fourth transistor is connected with a first scan line.

In some implementations, the fourth transistor has a switching characteristic contrary to that of the first transistor.

In some implementations, the second reset sub-circuit includes a fifth transistor;

a first electrode of the fifth transistor is connected with a reference voltage line, a second electrode of the fifth transistor is connected with the second node, and a control electrode of the fifth transistor is connected with a second reset signal line.

In some implementations, the fifth transistor has a switching characteristic contrary to that of the first transistor.

In some implementations, the storage sub-circuit includes a storage capacitor, a first terminal of the storage capacitor is connected to the second node, and a second terminal of the storage capacitor is connected with the first node.

An embodiment of the present disclosure further provides a pixel driving circuit, which includes: a data writing sub-circuit, a threshold compensation sub-circuit, a driving sub-circuit, a storage sub-circuit, a first reset sub-circuit, a second reset sub-circuit, a third reset sub-circuit, a first light emission control sub-circuit and the second light emission control sub-circuit; a connection node between the driving sub-circuit and a second terminal of the storage sub-circuit is a first node; a connection node between the data writing sub-circuit and a first terminal of the storage sub-circuit is a second node; a connection node between the driving sub-circuit and the threshold compensation sub-circuit is a third node;

the first reset sub-circuit includes a first transistor, a first electrode of the first transistor is connected with a first initialization signal line, a second electrode of the first transistor is connected with the first node, and a control electrode of the first transistor is connected with a first reset signal line;

the second reset sub-circuit includes a fifth transistor, a first electrode of the fifth transistor is connected with a reference voltage line, a second electrode of the fifth transistor is connected with the second node, and a control electrode of the fifth transistor is connected with a second reset signal line;

the driving sub-circuit includes a third transistor, a first electrode of the third transistor is connected with a first power terminal, a second electrode of the third transistor is connected with the third node, and a control electrode of the third transistor is connected with the first node;

the data writing sub-circuit includes a fourth transistor, a first electrode of the fourth electrode is connected to a data line, a second electrode of the fourth electrode is connected to the second node, and a control electrode of the fourth electrode is connected to a first scan line;

the threshold compensation sub-circuit includes a second transistor, a first electrode of the second transistor is connected with the first node, a second electrode of the second transistor is connected with the second node, and a control electrode of the second transistor is connected with a second scan line;

the first light emission control sub-circuit includes a sixth transistor, a first electrode of the sixth transistor is connected with the third node, a second electrode of the sixth transistor is connected with a light emitting device to be driven, and a control electrode of the sixth transistor is connected with a first light emission control line;

the second light emission control sub-circuit includes a seventh transistor, a first electrode of the seventh transistor is connected with a reference voltage line, a second electrode of the seventh transistor is connected with the second node, and a control electrode of the seventh transistor is connected with a second light emission control line;

the third reset sub-circuit includes an eighth transistor, a first electrode of the eighth transistor is connected with a first electrode of the light emitting device to be driven, a second electrode of the eighth transistor is connected with a second initialization signal line, and a control electrode of the eighth transistor is connected with a third reset signal line;

the storage sub-circuit includes a storage capacitor, a first terminal of the storage capacitor is connected with the second node, and a second terminal of the storage capacitor is connected with the first node;

at least one of the first transistor or the second transistor includes an oxide thin film transistor.

In some implementations, switching characteristics of the first transistor, the second transistor, and the eighth transistor are the same;

switching characteristics of the third transistor, the fourth transistor, the fifth transistor, the sixth transistor and the seventh transistor are the same; and the switching characteristic of the first transistor is contrary to that of the third transistor.

In a second aspect, an embodiment of the present disclosure provides a display panel, which includes the pixel driving circuit described above.

DETAIL DESCRIPTION OF EMBODIMENTS

In order to make those skilled in the art better understand the technical solutions of the present disclosure, the present disclosure is further described in detail with reference to the accompanying drawings and the detailed description below.

Unless defined otherwise, technical or scientific terms used herein shall have the ordinary meaning as understood by ordinary skills in the art to which the present disclosure belongs. The use of "first," "second," and the like in the present disclosure is not intended to indicate any order, quantity, or importance, but rather is used to distinguish one element from another. Also, the use of the terms "a," "an," or "the" and similar referents does not denote a limitation of quantity, but rather denotes the presence of at least one. The word "comprises/comprising" or "includes/including", and the like, means that the element or item preceding the word includes the element or item listed after the word and its equivalent, but does not exclude other elements or items. The terms "connected/connecting" or "coupled/coupling" and the like are not restricted to physical or mechanical connections, but may include electrical connections, whether direct or indirect. Terms "upper/on", "lower/under", "left", "right", and the like are used only to indicate relative positional relationships, and when the absolute position of the object being described is changed, the relative positional relationships may be changed accordingly.

Figure 1:
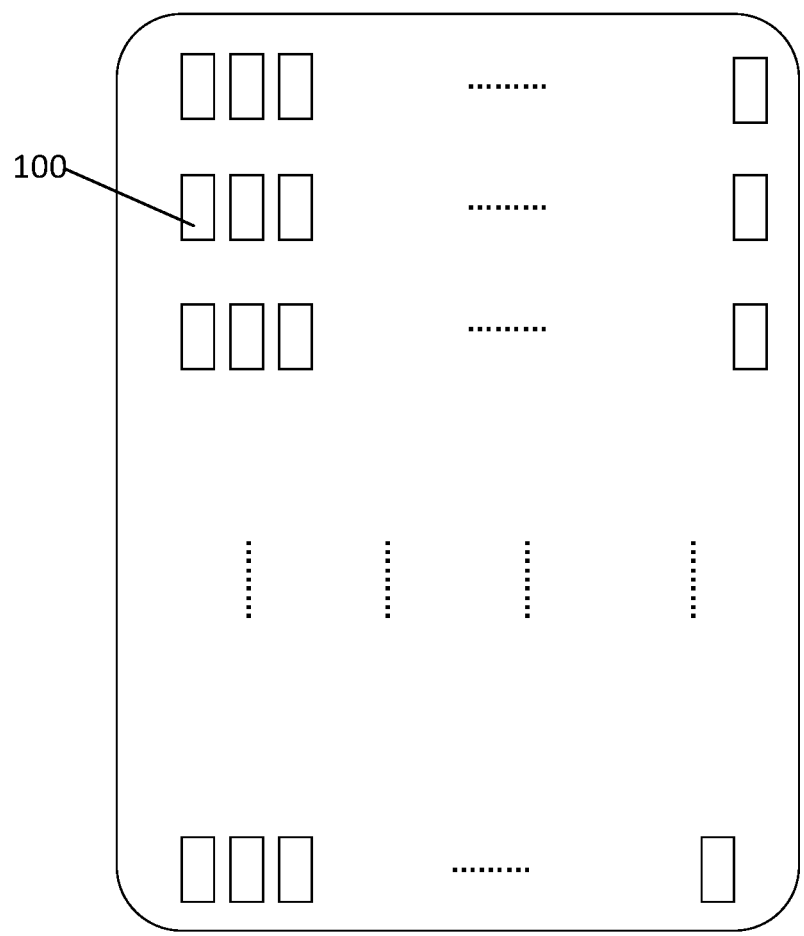
FIG. 1 is a schematic structural diagram of an exemplary display substrate.
Figure 2:
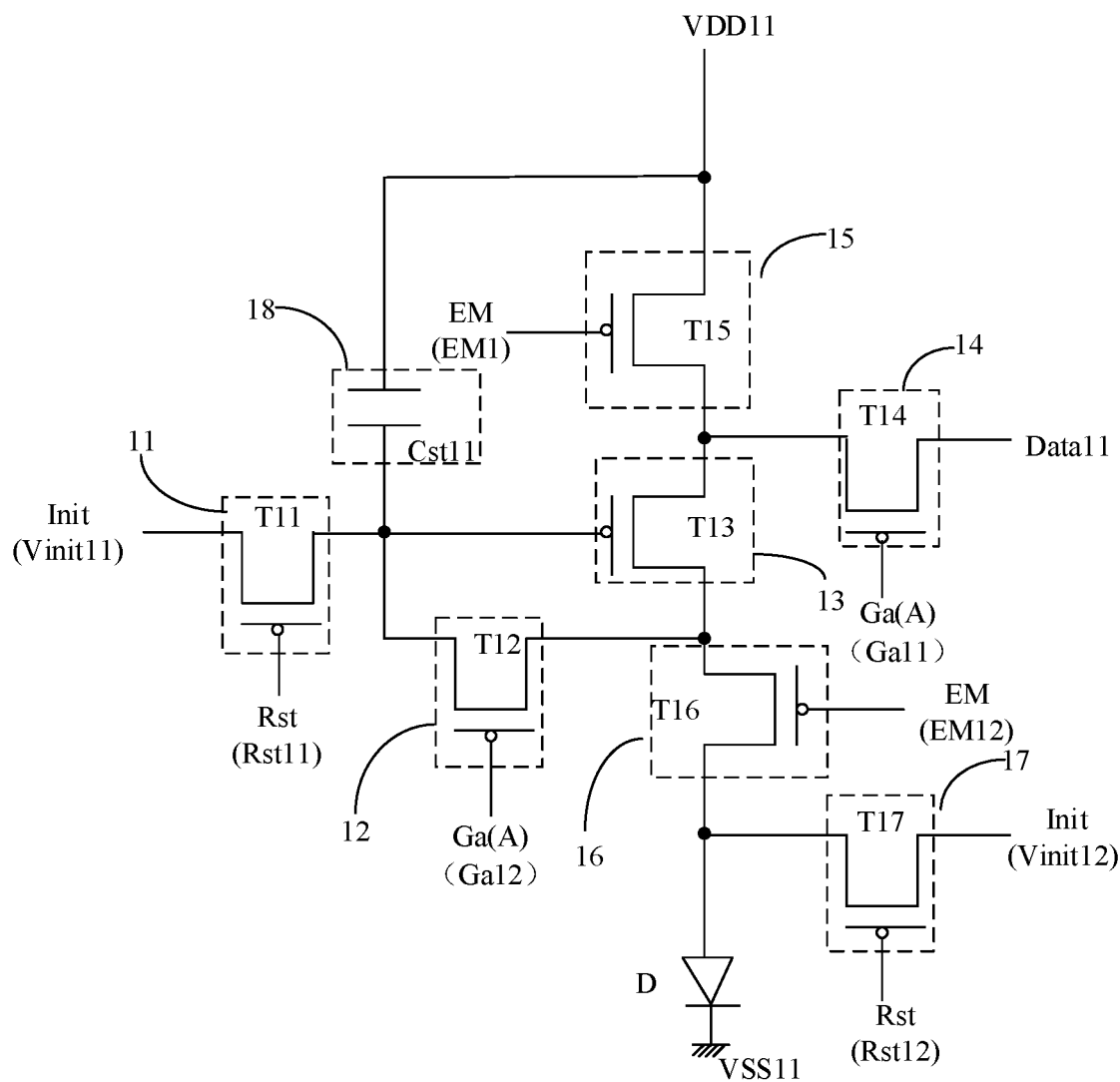
FIG. 2 is a schematic diagram of an exemplary pixel driving circuit.

FIG. 1 is a schematic structural diagram of an exemplary display substrate; FIG. 2 is a schematic diagram of an exemplary pixel driving circuit; as shown in FIGS. 1 and 2, the display substrate includes a plurality of pixel units arranged in an array, and each pixel unit 100 includes a pixel driving circuit and a light emitting device D therein. The pixel driving circuit in each pixel unit 100 may include: a first reset sub-circuit 11, a threshold compensation sub-circuit 121, a driving sub-circuit 13, a data writing sub-circuit 14, a first light emission control sub-circuit 15, a second light emission control sub-circuit 16, a second reset sub-circuit 17, and a storage sub-circuit 18.

The first reset sub-circuit 11 is connected to a control terminal of the driving sub-circuit 13 and is configured to reset the control terminal of the driving sub-circuit 13 under the control of a first reset signal. The threshold compensation sub-circuit 12 is electrically connected to the control terminal and a second terminal of the driving sub-circuit 13, respectively, and is configured to compensate a threshold value of the driving sub-circuit 13. The data writing sub-circuit 14 is electrically connected to a first terminal of the driving sub-circuit 13, and is configured to write a data signal into the storage sub-circuit under the control of a scan signal. The storage sub-circuit 8 is electrically connected to the control terminal of the driving sub-circuit 13 and a first power terminal VDD11, respectively, and is configured to store the data signal. The first light emission control sub-circuit 15 is respectively connected to the first power terminal VDD11 and the first terminal of the driving sub-circuit 13, and is configured to electrically connect/disconnect the driving sub-circuit 13 with/from the first power terminal VDD11, and the second light emission control sub-circuit 16 is respectively electrically connected to the second terminal of the driving sub-circuit 13 and a first electrode of the light emitting device D, and is configured to electrically connect/disconnect the driving sub-circuit 13 with/from the light emitting device D. The second reset sub-circuit 17 is electrically connected to the first electrode of the light emitting device D, and is configured to reset the first electrode of the light emitting device D under the control of a second reset control signal.

With continued reference to FIG. 2, the first reset sub-circuit includes a first reset transistor T11, the threshold compensation sub-circuit 12 includes a threshold compensation transistor T12, the driving sub-circuit 13 includes a driving transistor T13, the control terminal of the driving sub-circuit 13 includes a control electrode of the driving transistor T13, the first terminal of the driving sub-circuit 13 includes a first electrode of the driving transistor T13, and the second terminal of the driving sub-circuit 13 includes a second electrode of the driving transistor T13. The data writing sub-circuit 14 includes a data writing transistor T14, the storage sub-circuit 18 includes a storage capacitor Cst11, the first light emission control sub-circuit 15 includes a first light emission control transistor T15, the second light emission control sub-circuit 16 includes a second light emission control transistor T16, and the second reset sub-circuit 17 includes a second reset transistor T17.

It should be noted that, according to the characteristics of the transistors, the transistors may be divided into N-type transistors and P-type transistors, and for the sake of clarity, the solutions of the present disclosure are described in detail by taking the transistors in the pixel driving circuit in FIG. 2 being P-type transistors (for example, P-type MOS transistors) as an example, that is, in the description of the present disclosure, the driving transistor T13, the data writing transistor T14, the threshold compensation transistor T12, the first light emission control transistor T15, the second light emission control transistor T16, the first reset transistor T11, the second reset transistor T17, and the like may all be P-type transistors. However, the transistors in the embodiments of the present disclosure are not limited to P-type transistors, and one skilled in the art may also implement the functions of one or more transistors in the embodiments of the present disclosure by using N-type transistors (e.g., N-type MOS transistors) as desired.

In addition, the transistors adopted in the embodiments of the present disclosure may be thin film transistors, field effect transistors or other switching devices having the same characteristics, and the thin film transistors may include oxide semiconductor thin film transistors, amorphous silicon thin film transistors or polysilicon thin film transistors, and the like. Each transistor includes a first electrode, a second electrode and a control electrode; the control electrode serves as a gate of the transistor, one of the first electrode or the second electrode serves as a source of the transistor, and the other one of the first electrode or the second electrode serves as a drain of the transistor; the source and the drain of the transistor may be symmetrical in structure, so that there may be no difference in physical structure between the source and the drain of the transistor. In the embodiments of the present disclosure, in order to distinguish, except for the gate serving as the control electrode, the first electrode is directly described as the source, and the second electrode is described as the drain, so that the source and the drain of all or part of the transistors in the embodiments of the present disclosure may be interchanged as desired.

With continued reference to FIG. 2, a drain of the data writing transistor T14 is electrically connected to a source of the driving transistor T13, a source of the data writing transistor T14 is configured to be electrically connected to a data line Data11 to receive a data signal, and a gate of the data writing transistor T14 is configured to be electrically connected to a first scan signal line Ga11 to receive a scan signal; a second terminal of the storage capacitor Cst11 is electrically connected to the first power terminal VDD11, and a first terminal of the storage capacitor Cst11 is electrically connected to the gate of the driving transistor T13; a source of the threshold compensation transistor T12 is electrically connected to the gate of the driving transistor T13, a drain of the threshold compensation transistor T12 is electrically connected to the drain of the driving transistor T13, and a gate of the threshold compensation transistor T12 is configured to be electrically connected to a second scan signal line Ga12 to receive a compensation control signal; a source of the first reset transistor T11 is configured to be electrically connected to a first initialization signal line VInit11 to receive a first reset signal, a drain of the first reset transistor T11 is electrically connected to the gate of the driving transistor T13, and a gate of the first reset transistor T11 is configured to be electrically connected to a first reset control signal line Rst11 to receive a first reset control signal; a drain of the second reset transistor T17 is configured to be electrically connected to a second initialization signal line VInit12 to receive a second reset signal, a source of the second reset transistor T17 is electrically connected to the first electrode of the light emitting device D, and a gate of the second reset transistor T17 is configured to be electrically connected to a second reset control signal line Rst12 to receive a second reset control signal; a source of the first light emission control transistor T15 is electrically connected to the first power terminal VDD11, a drain of the first light emission control transistor T15 is electrically connected to the source of the driving transistor T13, and a gate of the first light emission control transistor T15 is configured to be electrically connected to a first light emission control signal line EM11 to receive a first light emission control signal; a source of the second light emission control transistor T16 is electrically connected with the drain of the driving transistor T13, a drain of the second light emission control transistor T16 is electrically connected with the first electrode of the light emitting device D, and a gate of the second light emission control transistor T16 is configured to be electrically connected to a second light emission control signal line EM12 to receive a second light emission control signal; a second electrode of the light emitting device D is electrically connected to a second power terminal VSS11.

For example, one of the first power terminal VDD11 or the second power terminal VSS11 is a high voltage terminal, and the other of the first power terminal VDD11 or the second power terminal VSS1 is a low voltage terminal. For example, as shown in FIG. 2, the first power terminal VDD11 is a voltage source to output a first voltage, which is constant and a positive voltage; and the second power terminal VSS11 may be a voltage source to output a second voltage, which is constant and a negative voltage or the like. For example, in some examples, the second power terminal VSS11 may be grounded.

With continued reference to FIG. 2, the scan signal and the compensation control signal may be the same, i.e., the gate of the data writing transistor T14 and the gate of the threshold compensation transistor T12 may be electrically connected to the same signal line, e.g., the first scan signal line Ga11, to receive the same signal (e.g., scan signal), and in this case, the display substrate may not be provided with the second scan signal line Ga12, thus reducing the number of signal lines. For another example, the gate of the data writing transistor T14 and the gate of the threshold compensation transistor T12 may be electrically connected to different signal lines, i.e., the gate of the data writing transistor T14 is electrically connected to the first scan signal line Ga11, the gate of the threshold compensation transistor T12 is electrically connected to the second scan signal line Ga12, and the signals transmitted by the first scan signal line Ga11 and the second scan signal line Ga12 are the same.

It should be noted that the scan signal and the compensation control signal may not be the same, so that the gates of the data writing transistor T14 and the threshold compensation transistor T12 may be separately controlled, thereby increasing the flexibility of controlling the pixel circuit. In the embodiments of the present disclosure, a case where the gate of the data writing transistor T14 and the gate of the threshold compensation transistor T12 are electrically connected to the first scan signal line Ga(A) is taken as an example for explanation.

With continued reference to FIG. 2, the first light emission control signal and the second light emission control signal may be the same, i.e., the gate of the first light emission control transistor T15 and the gate of the second light emission control transistor T16 may be electrically connected to the same signal line, e.g., the first light emission control signal line EM11, to receive the same signal (e.g., the first light emission control signal), in this case, the display substrate may not be provided with the second light emission control signal line EM12, thus reducing the number of signal lines. For another example, the gate of the first light emission control transistor T15 and the gate of the second light emission control transistor T16 may be electrically connected to different signal lines, respectively, that is, the gate of the first light emission control transistor T15 is electrically connected to the first light emission control signal line EM11, the gate of the second light emission control transistor T16 is electrically connected to the second light emission control signal line EM12, and the signals transmitted by the first light emission control signal line EM11 and the second light emission control signal line EM12 are the same.

It should be noted that, in a case where the first light emission control transistor T15 and the second light emission control transistor T16 are transistors in different types, for example, the first light emission control transistor T15 is a P-type transistor, and the second light emission control transistor T16 is an N-type transistor, the first light emission control signal and the second light emission control signal may also be different, which is not limited in the embodiment of the present disclosure. In the embodiments of the present disclosure, the case where the gates of the first light emission control transistor T15 and the second light emission control transistor T16 are both connected to a light emission control line EM is taken as an example for explanation.

For example, the first reset control signal and the second reset control signal may be the same, that is, the gate of the first reset transistor T11 and the gate of the second reset transistor T17 may be electrically connected to the same signal line, e.g., the first reset signal line Rst11, to receive the same signal (for example, a first reset control sub-signal), and in this case, the display substrate may not be provided with the second reset signal line Rst12, thus reducing the number of signal lines. For another example, the gate of the first reset transistor T11 and the gate of the second reset transistor T17 may be electrically connected to different signal lines, respectively, that is, the gate of the first reset transistor T11 is electrically connected to the first reset signal line Rst11, the gate of the second reset transistor T17 is electrically connected to the second reset signal line Rst12, and the signals transmitted by the first reset control signal line Rst11 and the second reset signal line Rst12 are the same. It should be noted that the first reset signal and the second reset signal may be different. It is exemplified in the embodiment of the present disclosure that the gate of the first reset transistor T11 and the gate of the second reset transistor T17 are both electrically connected to a reset control signal line Rst.

For example, in some examples, the second reset control signal may be the same as the scan signal, i.e., the gate of the second reset transistor T17 may be electrically connected to the scan signal line Ga(A) to receive the scan signal as a second reset control sub-signal.

For example, the source of the first reset transistor T11 and the drain of the second reset transistor T17 are connected to the first initialization signal line VInit11 and the second initialization signal line VInit12, respectively, and the first initialization signal line VInit11 and the second initialization signal line VInit12 may be DC reference voltage terminals to output a constant DC reference voltage. The first initialization signal line VInit11 and the second initialization signal line VInit12 may be the same, for example, the source of the first reset transistor T11 and the drain of the second reset transistor T17 are connected to a same initialization signal line. The first initialization signal line VInit11 and the second initialization signal line VInit12 may be high-voltage signal lines or low-voltage signal lines, as long as they can provide the first reset signal and the second reset signal to reset the gate of the driving transistor T13 and the first electrode of the light emitting element, which is not limited in the present disclosure. For example, the source of the first reset transistor T11 and the drain of the second reset transistor T17 may both be connected to a reset power signal line Init.

It should be noted that, in the embodiment of the present disclosure, a case where the gate of the first reset transistor T11 and the gate of the second reset transistor T17 are both electrically connected to the first reset control signal line Rst11, and the source of the first reset transistor T11 and the drain of the second reset transistor T17 are both electrically connected to the reset power signal line Init is taken as an example for explanation. In addition, the first reset sub-circuit 11, the threshold compensation sub-circuit 12, the driving sub-circuit 13, the data writing sub-circuit 14, the first light emission control sub-circuit 15, the second light emission control sub-circuit 16, the second reset sub-circuit 17, and the storage sub-circuit 8 in the pixel circuit shown in FIG. 2 are only schematic, and specific structures of the sub-circuits such as the first reset sub-circuit 11, the threshold compensation sub-circuit 12, the driving sub-circuit 13, the data writing sub-circuit 14, the first light emission control sub-circuit 15, the second light emission control sub-circuit 16, the second reset sub-circuit 17, and the storage sub-circuit 8 may be set as desired, which is not particularly limited in the embodiments of the present disclosure.

It should be noted that, in the embodiment of the present disclosure, in addition to the 7T1C (i.e., seven transistors and one capacitor) structure shown in FIG. 2, the pixel circuit of the sub-pixel may also be in a circuit structure including another number of transistors and another number of capacitors, such as a 7T12C structure, a 6T1C structure, a 6T12C structure, or a 9T12C structure, which is not limited in the embodiment of the present disclosure.

The light emitting device D in the embodiment of the present disclosure may be an Organic Light Emitting Diode (OLED). Certainly, the light emitting device D may also be a Micro Inorganic Light Emitting Diode, and further, may be an electric current type Light Emitting Diode, such as a Micro Light Emitting Diode (Micro LED) or a Mini Light Emitting Diode (Mini LED). One of the first electrode or the second electrode of the light emitting device D is an anode, and the other of the first electrode or the second electrode of the light emitting device D is a cathode; in the embodiment of the present disclosure, a case where the first electrode of the light emitting device D is the anode, and the second electrode of the light emitting device D is the cathode is taken as an example for explanation.

It is found that, in general, the transistors in the pixel driving circuit are all low-temperature polysilicon transistors, and the drain of the first reset transistor and the source of the threshold compensation transistor are both connected with the gate of the driving transistor, so that when a leakage current occurs in the first reset transistor and the threshold compensation transistor, a voltage at the gate of the driving transistor is affected, and the problem of abnormal display is caused.

In view of the above problems, the following technical solutions are provided in the embodiments of the present disclosure.

Figure 3:
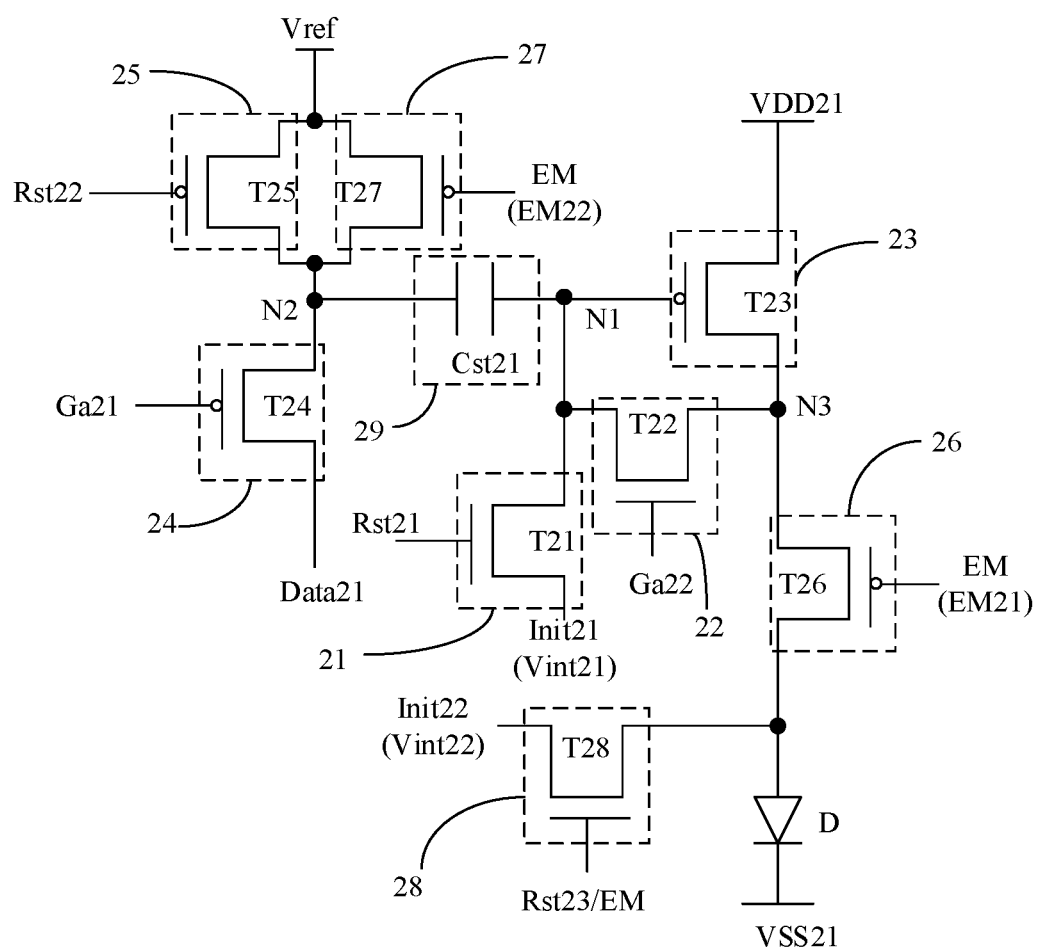
FIG. 3 is a schematic diagram of a pixel driving circuit according to an embodiment of the present disclosure.

In a first aspect, FIG. 3 is a schematic diagram of a pixel driving circuit according to an embodiment of the present disclosure; as shown in FIG. 3, the embodiment of the present disclosure provides a pixel driving circuit, which includes: a data writing sub-circuit 24, a threshold compensation sub-circuit 22, a driving sub-circuit 23, a storage sub-circuit 29, a first reset sub-circuit 21, and a second reset sub-circuit 25. A connection node between the driving sub-circuit 23 and a second terminal of the storage sub-circuit 29 is a first node N1; a connection node between the data writing sub-circuit 24 and a first terminal of the storage sub-circuit 29 is a second node N2; a connection node between the driving sub-circuit 23 and the threshold compensation sub-circuit 22 is a third node N3. In the embodiment of the present disclosure, the first reset sub-circuit 21 is configured to initialize (i.e., reset) a potential of the first node N1 by a first initialization signal under the control of a first reset signal. The second reset sub-circuit 25 is configured to write a reference voltage to the second node N2 to reset the second node N2 under the control of a second reset signal. The data writing sub-circuit 24 is configured to transmit a data voltage to the second node N2 in response to a first scan signal, so that the data voltage is stored in the storage sub-circuit 29; the threshold compensation sub-circuit 22 is configured to write a threshold voltage to the first node N1 in response to the second scan signal. The driving sub-circuit 23 is configured to supply a driving current to the light emitting device D to be driven according to potentials of the first node N1 and the third node N3. The storage sub-circuit 29 is configured to store the data voltage.

In the embodiment of the present disclosure, the first reset sub-circuit 21 may include a first transistor T21, and the threshold compensation sub-circuit 22 may include a second transistor T22. A source of the first transistor T21 is connected to a first initialization signal line Init21, a drain of the first transistor T21 is connected to the first node N1, and a gate of the first transistor T21 is connected to a first reset signal line Rst21. A source of the second transistor T22 is connected to the first node N1, a drain of the second transistor T22 is connected to the third node N3, and a gate of the second transistor T22 is connected to a second scan line Ga2. In particular, at least one of the first transistor T21 or the second transistor T22 is an oxide thin film transistor. Since the drain of the first transistor T21 and the source of the second transistor T22 are both connected to the first node N1, in this case, if the first transistor T21 is an oxide thin film transistor, the potential of the first node N1 can be effectively prevented from being influenced by the leakage current of the first transistor T21, and similarly, if the second transistor T22 is an oxide thin film transistor, the potential of the first node N1 can be effectively prevented from being influenced by the leakage current of the second transistor T22. It should be noted that, in order to ensure the performance of the pixel driving circuit as much as possible, in the embodiment of the present disclosure, the first transistor T21 and the second transistor T22 may be both oxide thin film transistors. In the following description, a case where the first transistor T21 and the second transistor T22 are both oxide thin film transistors is taken as an example for explanation.

In some examples, the first transistor T21 and the second transistor T22 not only both are oxide thin film transistors but also have the same switching characteristics, and in this case, the second transistor T22 may be formed during the first transistor T21 being formed, so that the process steps and costs are not increased. In the embodiment of the present disclosure, the first transistor T21 and the second transistor T22 are both N-type transistors.

In some examples, with continued reference to FIG. 3, the pixel driving circuit in the embodiment of the present disclosure includes not only the above-described structure but also a first light emission control sub-circuit 26 and a second light emission control sub-circuit 27. The first light emission control sub-circuit 26 is configured to transmit a driving current generated by the driving sub-circuit 23 to the light emitting device D to be driven under the control of a first light emission control signal; and the second light emission control sub-circuit 27 is configured to transmit a reference voltage to the second node N2 under the control of a second light emission control signal.

For example, the first light emission control sub-circuit 26 includes a sixth transistor T26, and the second light emission control sub-circuit 27 includes a seventh transistor T27. A source of the sixth transistor T26 is connected to the third node N3, a drain of the sixth transistor T26 is connected to an anode of the light emitting device D to be driven, and a gate of the sixth transistor T26 is connected to a first light emission control line EM21. A source of the seventh transistor T27 is connected to a reference voltage line, a drain of the seventh transistor T27 is connected to the second node N2, and a gate of the seventh transistor T27 is connected to a second light emission control line EM22. In some examples, since the first light emission control sub-circuit 26 (the sixth transistor T26) and the second light emission control sub-circuit 27 (the seventh transistor T27) both operate in a light emission stage, that is, they have the same operation timing, the light emission control line EM21 for controlling the first light emission control sub-circuit 26 and the light emission control line EM22 for controlling the second light emission control sub-circuit 27 may be a same light emission control line EM. In the following description, a case where both the first light emission control line EM21 and the second light emission control line EM22 are the emission control line EM, that is, the first light emission control line EM21 and the second light emission control line EM22 are both referred to as the light emission control line EM is taken as an example. In some examples, the switching characteristics of the sixth transistor T26 and the seventh transistor T27 may be the same, and may be different from the switching characteristic of the first transistor T21, that is, the first transistor T21 is an N-type transistor, and the sixth transistor T26 and the seventh transistor T27 both are P-type transistors, or, the first transistor T21 is a P-type transistor, and the sixth transistor T26 and the seventh transistor T27 both are N-type transistors. In some examples, bothe the sixth transistor T26 and the seventh transistor T27 may be low temperature polysilicon thin film transistors or oxide thin film transistors. In the embodiment of the present disclosure, a case where the sixth transistor T26 and the seventh transistor T27 both are low temperature polysilicon thin film transistors is taken as an example.

Specifically, in an initialization stage, a high level signal is written into the first reset signal line Rst21, the first transistor T21 is turned on, and the potential of the first node N1 is initialized by the first initialization signal written into the first initialization signal line Init 21. Moreover, the second reset signal is a working level signal, the second reset sub-circuit 25 operates, and the reference voltage is written into the second node N2 to initialize the potential of the second node N2. In a data voltage writing and threshold compensation stage, the first scan signal is a working level signal, the data writing sub-circuit 24 operates, and a data voltage signal is written into the second node N2 through the data writing sub-circuit 24, that is, the potential of the second node N2 is equal to Vdata21; furthermore, a high level signal is written into the second scan line Ga22, the second transistor T22 is turned on, a threshold voltage Vth is written into the first node N1 through the second transistor T22, so that the potential of the first node N1 is equal to a sum of a first power voltage VDD21 and the threshold voltage Vth, that is, the potential of the first node N1 is equal to VDD21+Vth. In a light emission stage, a low level signal is written into the light emission control line EM, the sixth transistor T26 and the seventh transistor T27 are simultaneously turned on, the potential of the second node N2 jumps from Vdata21 to the reference voltage Vref, and the jumped voltage of the second node N2 is written into the first node N1 under the action of the storage sub-circuit 29, the potential of the first node N1 is equal to VDD21+Vth+Vref−Vdata21. In this case, the driving sub-circuit 23 generates a driving current according to the potentials of the first node N1 and the third node N3 to drive the light emitting device D to emit light.

In some examples, with continued reference to FIG. 3, the pixel driving circuit in the embodiment of the present disclosure may include not only the above-described structures but also a third reset sub-circuit 28. The third reset sub-circuit 28 is configured to reset a potential of the anode of the light emitting device D by a second initialization signal under the control of a third reset signal. In the embodiment of the present disclosure, the first node N1 is reset by the first reset sub-circuit 21, and the anode of the light emitting device D is reset by the third reset sub-circuit 28; that is, the reset circuit for resetting the first node N1 and the reset circuit for resetting the anode of the light emitting device D are two different reset circuits. In this case, compared with the existing product, the reset of the anode of the light emitting device D can be controlled independently, and in cases where the light emitting device D displays different gray scales, the light emitting device D can be reset by using different initialization voltages, and the anode of the light emitting device D can be initialized by the third reset sub-circuit 28 not only in the initialization stage during each frame refreshing, but also during the frame holding. The frame holding refers to a period between two frame refreshings. Therefore, the brightness difference between the frame refreshing and the frame holding can be effectively improved, and the probability of flicker of the display panel is reduced.

For example, the third reset sub-circuit 28 may include an eighth transistor T28, a source of the eighth transistor T28 is connected to the anode of the light emitting device D to be driven, a drain of the eighth transistor T28 is connected to a second initialization signal line Init22, and a gate of the eighth transistor T28 is connected to a third reset signal line Rst23.

In some examples, the switching characteristic of the eighth transistor T28 may be the same as that of the first transistor T21, i.e., is different from (contrary to) the switching characteristic of the sixth transistor T26 in the first light emission control circuit. In this case, the emission control line EM may be common to the third reset signal line Rst23. For example, a PWM modulation signal is used as the light emission control signal, and a case where four pulse signals are inserted into the light emission control line EM in each period (a duration of refreshing one frame plus a duration of holding the frame) is taken as an example. In an initialization stage, an emission control signal written into the emission control line EM is a high level signal, the eighth transistor T28 is turned on, and the anode of the light emitting device D is reset by the second initialization signal written into the second initialization line. In a light emission stage, the light emission control signal written into the light emission control line EM is a low level signal, the sixth transistor T26 is turned on, and the driving current generated by the driving sub-circuit 23 is transmitted to the light emitting device D through the sixth transistor T26 to drive the light emitting device D to emit light. In a case where the emission control line EM is common to the third reset signal line Rst23, the number of control signal lines can be effectively reduced, which is helpful for improving an aperture ratio of the pixel of the display substrate to which the pixel driving circuit is applied. Certainly, it is also feasible to control the eighth transistor T28 by using the separate third reset signal line Rst23, and in this case, the eighth transistor T28 may not have the same switching characteristic as the first transistor T21, and may be a thin film transistor having the same switching characteristic as the sixth transistor T26.

Further, in a case where the eighth transistor T28 in the third reset sub-circuit 28 in the embodiment of the present disclosure is a thin film transistor having the same switching characteristic as the first transistor T21 in the first reset sub-circuit 21, the eighth transistor T28 may be an oxide thin film transistor, and thus, the eighth transistor T28 may be formed during the first transistor T21 being formed without increasing the process steps and the cost. Certainly, it is also feasible for the eighth transistor T28 to be another type of thin film transistor, such as a low temperature polysilicon thin film transistor. In some examples, in the embodiment of the present disclosure, for the pixel driving circuit described above, the driving sub-circuit 23 includes a third transistor T23, a source of the third transistor T23 is connected to the first power terminal VDD21, a drain of the third transistor T23 is connected to the third node N3, and a gate of the third transistor T23 is connected to the first node N1.

For example, in the light emission stage, the third transistor T23 may generate a corresponding driving current according to the potentials of the gate (first node N1) and the source (VDD) thereof, so as to drive the light emitting device D to emit light. In some examples, the switching characteristic of the third transistor T23 is contrary to that of the first transistor, i.e., the third transistor T23 is a P-type transistor.

In some examples, with continued reference to FIG. 3, in the embodiment of the present disclosure, for the pixel driving circuit described above, the data writing sub-circuit 24 may include a fourth transistor T24, a source of the fourth transistor T24 is connected to a data line Data21, a drain of the fourth transistor T24 is connected to the second node N2, and a gate of the fourth transistor T24 is connected to a first scan line Ga1.

For example, the switching characteristic of the fourth transistor T24 is contrary to that of the first transistor T21 in the first reset sub-circuit 21, i.e., the fourth transistor T24 is a P-type transistor. Specifically, in a data writing and threshold compensation stage, a low level signal in written into the first scan line Ga1, the fourth transistor T24 is turned on, and a data voltage of the data line Data21 is written into the second node N2 through the fourth transistor T24, and is stored in the storage sub-circuit 29. Certainly, the fourth transistor T24 may have the same switching characteristic as the first transistor T21 in the first reset sub-circuit 21, that is, the fourth transistor T24 may also be an N-type transistor, and in this case, the fourth transistor T24 operates in response to that a high level signal is written into the first scan line Ga1. In addition, the fourth transistor T24 in the embodiment of the present disclosure may be an oxide thin film transistor, a low temperature polysilicon thin film transistor, or another type of thin film transistor, and a case where the fourth transistor T24 is a low temperature polysilicon thin film transistor is taken as an example in the embodiment of the present disclosure.

In some examples, with continued reference to FIG. 3, in the embodiment of the present disclosure, for the pixel driving circuit described above, the second reset sub-circuit 25 therein may include a fifth transistor T25, a source of the fifth transistor T25 is connected to the reference voltage line, a drain of the fifth transistor T25 is connected to the second node N2, and a gate of the fifth transistor T25 is connected to a second reset signal line Rst22.

For example, the switching characteristic of the fifth transistor T25 is contrary to that of the first transistor T21 in the first reset sub-circuit 21, that is, the fifth transistor T25 is a P-type transistor. Specifically, in the initialization stage, the fifth transistor T25 may be turned on by writing a low level signal into the second reset signal line Rst22, and the potential of the second node N2 is initialized by the reference voltage written into the reference voltage line, that is, the reset of the second node N2 is completed. Certainly, the fifth transistor T25 may have the same switching characteristic as the first transistor T21 in the first reset sub-circuit 21, that is, the fifth transistor T25 may also be an N-type transistor, and in this case, the fifth transistor T25 operates in response to that a high level signal is written into the first scan line Ga1. In addition, the fifth transistor T25 in the embodiment of the present disclosure may be an oxide thin film transistor, a low temperature polysilicon thin film transistor, or another type of thin film transistor, and a case where the fifth transistor T25 is the low temperature polysilicon thin film transistor is taken as an example in the embodiment of the present disclosure.

In some examples, with continued reference to FIG. 3, in the embodiment of the present disclosure, for the pixel driving circuit described above, the storage sub-circuit 29 therein may include a storage capacitor Cst21, a first terminal of the storage capacitor Cst21 is connected to the second node N2, and a second terminal of the storage capacitor Cst21 is connected to the first node N1. For the specific function of the storage capacitor Cst21 in the pixel driving circuit, a detailed description thereof is given in a method for driving the pixel driving circuit described below.

As shown in FIG. 3, the embodiment of the present disclosure provides a pixel driving circuit, which includes: a data writing sub-circuit 24, a threshold compensation sub-circuit 22, a driving sub-circuit 23, a storage sub-circuit 29, a first reset sub-circuit 21, a second reset sub-circuit 25, a third reset sub-circuit 28, a first light emission control sub-circuit 26, and a second light emission control sub-circuit 27. A connection node between the driving sub-circuit 23 and a second terminal of the storage sub-circuit 29 is a first node N1; a connection node between the data writing sub-circuit 24 and a first terminal of the storage sub-circuit 29 is a second node N2; a connection node between the driving sub-circuit 23 and the threshold compensation sub-circuit 22 is a third node N3; the first reset sub-circuit 21 includes a first transistor T21; the second reset sub-circuit 25 includes a fifth transistor T25; the driving sub-circuit 23 includes a third transistor T23; the data writing sub-circuit 24 includes a fourth transistor T24; the threshold compensation sub-circuit 22 includes a second transistor T22; the first light emission control sub-circuit 26 includes a sixth transistor T26; the second light emission control sub-circuit 27 includes a seventh transistor T27; the third reset sub-circuit 28 includes an eighth transistor T28; and the storage sub-circuit 29 includes a storage capacitor Cst 21. At least one of the first transistor T21 or the second transistor T22 is an oxide thin film transistor, and a case where the first transistor T21 and the second transistor T22 are both oxide thin film transistors is taken as an example in the following description. In addition, the eighth transistor T28 may also be an oxide thin film transistor, and in order to reduce the process steps, the switching characteristics of the first transistor T21, the second transistor T22, and the eighth transistor T28 are the same, and in the embodiment of the present disclosure, a case where the first transistor T21, the second transistor T22, and the eighth transistor T28 are all N-type transistors is taken as an example. The switching characteristics of the third transistor T23, the fourth transistor T24, the fifth transistor T25, the sixth transistor T26, and the seventh transistor T27 are contrary to the switching characteristic of the first transistor T21, that is, the third transistor T23, the fourth transistor T24, the fifth transistor T25, the sixth transistor T26, and the seventh transistor T27 are P-type transistors, and in addition, in the embodiment of the present disclosure, the third transistor T23, the fourth transistor T24, the fifth transistor T25, the sixth transistor T26 and the seventh transistor T27 may all be low-temperature polysilicon thin film transistors, certainly, the third transistor T23, the fourth transistor T24, the fifth transistor T25, the sixth transistor T26 and the seventh transistor T27 may be oxide thin film transistors or other types of thin film transistors, and in the embodiment of the present disclosure, a case where the third transistor T23, the fourth transistor T24, the fifth transistor T25, the sixth transistor T26, and the seventh transistor T27 are low-temperature polysilicon thin film transistors is taken as an example. Specifically, a source of the first transistor T21 is connected to a first initialization signal line Init21, a drain of the first transistor T21 is connected to the first node N1, and a gate of the first transistor T21 is connected to a first reset signal line Rst21. A source of the fifth transistor T25 is connected to a reference voltage line, a drain of the fifth transistor T25 is connected to the second node N2, and a gate of the fifth transistor T25 is connected to a second reset signal line Rst22. A source of the third transistor T23 is connected to a first power terminal VDD21, a drain of the third transistor T23 is connected to the third node N3, and a gate of the third transistor T23 is connected to the first node N1. A source of the fourth transistor T24 is connected to a data line Data21, a drain of the fourth transistor T24 is connected to the second node N2, and a gate of the fourth transistor T24 is connected to a first scan line Ga1. A source of the second transistor T22 is connected to the first node N1, a drain of the second transistor T22 is connected to the second node N2, and a gate of the second transistor T22 is connected to a second scanning line Ga2. A source of the sixth transistor T26 is connected to the third node N3, a drain of the sixth transistor T26 is connected to a light emitting device D to be driven, and a gate of the sixth transistor T26 is connected to a light emission control line EM. A source of the seventh transistor T27 is connected to the reference voltage line, a drain of the seventh transistor T27 is connected to the second node N2, and a gate of the seventh transistor T27 is connected to the emission control line EM. A source of the eighth transistor T28 is connected to an anode of the light emitting device D to be driven, a drain of the eighth transistor T28 is connected to a second initialization signal line Init22, a gate of the eighth transistor T28 is connected to a third reset signal line Rst23, and the gate of the eighth transistor T28 may be further connected to the light emission control line EM because the switching characteristics of the eighth transistor T28 and the sixth transistor T26 are different. A first terminal of the storage capacitor Cst21 is connected to the second node N2, and a second terminal of the storage capacitor Cst21 is connected to the first node N1.

Figure 4:
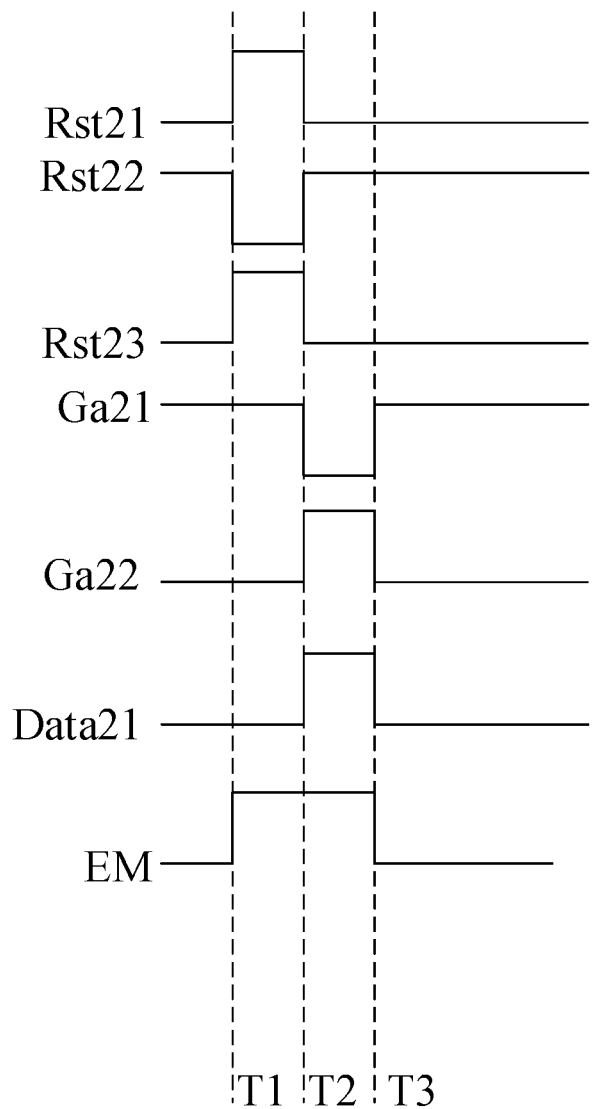
FIG. 4 is a timing sequence diagram illustrating an operation of the pixel driving circuit shown in FIG. 3.
Figure 5:
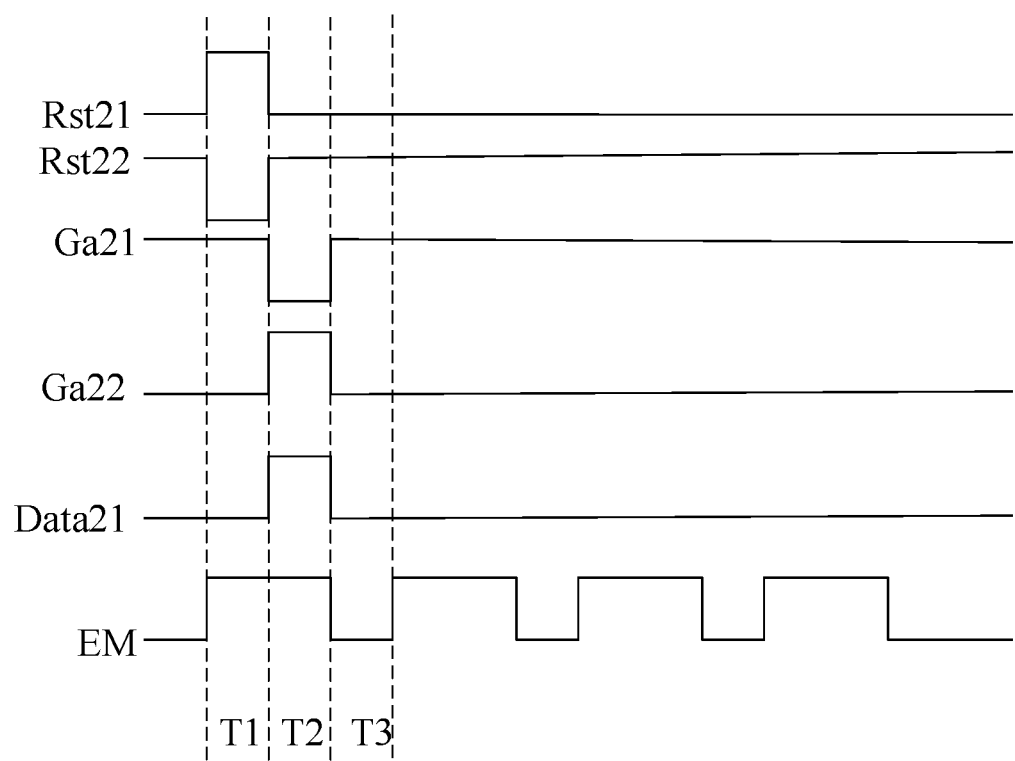
FIG. 5 is a timing sequence diagram illustrating an operation of the pixel driving circuit shown in FIG. 3.

In order to more clearly understand the pixel driving circuit in the embodiment of the present disclosure, the following description is made in conjunction with a method for driving the pixel driving circuit. FIG. 4 is a timing sequence diagram illustrating an operation of the pixel driving circuit shown in FIG. 3, and FIG. 5 is a timing sequence diagram illustrating an operation of the pixel driving circuit shown in FIG. 3. Note that a difference between FIGS. 4 and 5 is only in that the eighth transistor T28 is controlled by the third reset control line or the light emission control line EM, and the operation principles of the timing sequence of FIG. 4 and the timing sequence of FIG. 5 are substantially the same, and the following description will be given by taking the control of the timing sequence of FIG. 5 as an example. Note that, since the gate of the eighth transistor T28 and the gate of the sixth transistor T26 are both connected to the light emission control line EM, the light emission control signal written into the light emission control line EM is a PWM modulation signal, and a case where four pulse signals are inserted into the light emission control line EM in each period (a duration of refreshing one frame plus a duration of holding the frame).

In an initialization stage (T1), a first reset signal written into the first reset signal line Rst21 is a high level signal, a second reset signal written into the second reset signal line Rst22 is a low level signal, a light emission control signal written into the light emission control line EM is a high level signal, in this case, the first transistor T21, the fifth transistor T25 and the eighth transistor T28 are all turned on, a first initialization signal of the first initialization signal line Init21 is written into the first node N1 through the first transistor T21, that is, a potential of the first node N1 is equal to Vint1; a reference voltage of the reference voltage line is written into the second node N2 through the fifth transistor T25, that is, a potential of the second node N2 is equal to Vref; a second initialization signal of the second initialization signal line Init22 is written into the anode of the light emitting device D to be driven through the eighth transistor T28, that is, a potential of the anode of the light emitting device D to be driven is equal to Vint22. It should be noted that Vint21 is a voltage for resetting the gate of the third transistor T23, and generally takes a value from −1V to −5V, and a specific value thereof may be set by referring to a compensation effect and a brightness condition in a black frame. Vint2 may be set based on a voltage VSS21 of a cathode of the light emitting device D to be driven, or may be a pulse signal, and generally, Vint2 is set to be close to VSS21, or may be a voltage (for example, between −2V and −6V) that just ensures that the light emitting device D cannot be turned on.

In a data writing and threshold compensation stage (T2): a low level signal is written into the first scan signal line and a high level signal is written into the second scan signal line, in this case, the second transistor T22 and the fourth transistor T24 are turned on, and a data voltage signal of the data line Data21 is written into the second node N2 through the fourth transistor T24, that is, a potential of the second node N2 is equal to Vdata21; meanwhile, since the second transistor T22 is turned on, a threshold voltage Vth is written into the first node N1 through the second transistor T22, and thus a potential of the first node N1 is equal to a sum of the first power voltage VDD21 and the threshold voltage Vth, that is, the potential of the first node N1 is equal to VDD21+Vth.

In a light emission stage (T3), a low level signal is written into the light emission control line EM, the sixth transistor T26 and the seventh transistor T27 are simultaneously turned on, the potential of the second node N2 jumps from Vdata to a reference voltage Vref, and the jumped voltage of the second node N2 is written into the first node N1 under the action of the storage capacitor Cst21, so that the potential of the first node N1 is equal to VDD21+Vth+Vref-Vdata21. In this case, a driving current generated by the third transistor T23 drives the light emitting device D to emit light.

In addition, after each frame is refreshed, a frame holding stage is entered, in this case, the light emission control signal is a high-level signal, the eighth transistor T28 is turned on, and the voltage of the anode of the light emitting device D is reset by the second initialization signal written into the second initialization signal line Init22, so that voltages of anodes of light emitting devices D in the display substrate at a starting time of refreshing a next frame is ensured to be consistent, the consistency of the response time of the light-emitting devices D is effectively improved, which facilitates to improve low-gray-level Mura and Flicker.

In a second aspect, an embodiment of the present disclosure further provides a display panel, which includes the pixel driving circuit described above, so that the display panel of the present embodiment has a better display effect.

The display panel may be a liquid crystal display device or an electroluminescence display device, for example, any product or component with a display function such as an OLED panel, a Micro LED panel, a Mini LED panel, a mobile phone, a tablet computer, a television, a display, a notebook computer, a digital photo frame, and a navigator.

It will be understood that the above embodiments are merely exemplary embodiments adopted to illustrate the principles of the present disclosure, and the present disclosure is not limited thereto. It will be apparent to those skilled in the art that various modifications and improvements can be made without departing from the spirit and scope of the present disclosure, and such modifications and improvements are also considered to be within the scope of the present disclosure.

What is claimed is:

1. A pixel driving circuit, comprising: a data writing sub-circuit, the threshold compensation sub-circuit, a driving sub-circuit, the storage sub-circuit, a first reset sub-circuit and a second reset sub-circuit; wherein a connection node between the driving sub-circuit and a second terminal of the storage sub-circuit is a first node; a connection node between the data writing sub-circuit and a first terminal of the storage sub-circuit is a second node; a connection node between the driving sub-circuit and the threshold compensation sub-circuit is a third node;
the first reset sub-circuit comprises a first transistor, a control electrode of the first transistor is connected with a first reset signal line, a first electrode of the first transistor is connected with a first initialization signal line, and a second electrode of the first transistor is connected with the first node;
the second reset sub-circuit is configured to reset a potential of the second node by a reference voltage under control of a second reset signal;
the data writing sub-circuit is configured to transmit, in response to a first scan signal, a data voltage to the second node to store the data voltage in the storage sub-circuit;
the threshold compensation sub-circuit comprises a second transistor, a first electrode of the second transistor is connected with the first node, a second electrode of the second transistor is connected with the second node, and a control electrode of the second transistor is connected with a second scan line;
the driving sub-circuit is configured to provide a driving current for a light emitting device to be driven according to potentials of the first node and the third node;
the storage sub-circuit is configured to store the data voltage; wherein,
at least one of the first transistor or the second transistor comprises an oxide thin film transistor,
the pixel driving circuit further comprises: a first light emission control sub-circuit and a second light emission control sub-circuit, wherein
the first light emission control sub-circuit is configured to transmit the driving current generated by the driving sub-circuit to the light emitting device to be driven under control of a first light emission control signal; and the second light emission control sub-circuit is configured to transmit the reference voltage to the second node under control of a second light emission control signal, wherein
the first light emission control sub-circuit comprises a sixth transistor, and the second light emission control sub-circuit comprises a seventh transistor;
a first electrode of the sixth transistor is connected with the third node, a second electrode of the sixth transistor is connected with the light emitting device to be driven, and a control electrode of the sixth transistor is connected with a first light emission control line; and
a first electrode of the seventh transistor is connected with a reference voltage line, a second electrode of the seventh transistor is connected with the second node, and a control electrode of the seventh transistor is connected with a second light emission control line.

2. The pixel driving circuit according to claim 1, wherein switching characteristics of the sixth transistor and the seventh transistor are the same and are contrary to a switching characteristic of the first transistor.

3. The pixel driving circuit according to claim 2, further comprising: a third reset sub-circuit, wherein
the third reset sub-circuit is configured to initialize the light emitting device to be driven by a second initialization signal under control of a third reset signal.

4. The pixel driving circuit according to claim 3, wherein the third reset sub-circuit comprises an eighth transistor;
a first electrode of the eighth transistor is connected with a first electrode of the light-emitting device to be driven, a second electrode of the eighth transistor is connected with a second initialization signal line, and a control electrode of the eighth transistor is connected with a third reset signal line.

5. The pixel driving circuit according to claim 4, wherein the eighth transistor has a switching characteristic contrary to that of the sixth transistor, and the first light emission control line is common to the third reset signal line.

6. The pixel driving circuit according to claim 4, wherein the eighth transistor comprises an oxide thin film transistor.

7. The pixel driving circuit according to claim 1, wherein the driving sub-circuit comprises a third transistor;
a first electrode of the third transistor is connected to a first power terminal, a second electrode of the third transistor is connected to the third node, and a control electrode of the third transistor is connected to the first node.

8. The pixel driving circuit according to claim 7, wherein the third transistor has a switching characteristic contrary to that of the first transistor.

9. The pixel driving circuit according to claim 1, wherein the data writing sub-circuit comprises a fourth transistor;
a first electrode of the fourth transistor is connected with a data line, a second electrode of the fourth transistor is connected with the second node, and a control electrode of the fourth transistor is connected with a first scan line.

10. The pixel driving circuit according to claim 9, wherein the fourth transistor has a switching characteristic contrary to that of the first transistor.

11. The pixel driving circuit according to claim 1, wherein the second reset sub-circuit comprises a fifth transistor;
a first electrode of the fifth transistor is connected with a reference voltage line, a second electrode of the fifth transistor is connected with the second node, and a control electrode of the fifth transistor is connected with a second reset signal line.

12. The pixel driving circuit according to claim 11, wherein the fifth transistor has a switching characteristic contrary to that of the first transistor.

13. The pixel driving circuit according to claim 1, wherein the storage sub-circuit comprises a storage capacitor, a first terminal of the storage capacitor is connected to the second node, and a second terminal of the storage capacitor is connected with the first node.

14. A display panel, comprising the pixel driving circuit of claim 1.

15. A pixel driving circuit, comprising: a data writing sub-circuit, a threshold compensation sub-circuit, a driving sub-circuit, a storage sub-circuit, a first reset sub-circuit, a second reset sub-circuit, a third reset sub-circuit, a first light emission control sub-circuit and the second light emission control sub-circuit; wherein a connection node between the driving sub-circuit and a second terminal of the storage sub-circuit is a first node; a connection node between the data writing sub-circuit and a first terminal of the storage sub-circuit is a second node; a connection node between the driving sub-circuit and the threshold compensation sub-circuit is a third node;
the first reset sub-circuit comprises a first transistor, a first electrode of the first transistor is connected with a first initialization signal line, a second electrode of the first transistor is connected with the first node, and a control electrode of the first transistor is connected with a first reset signal line;
the second reset sub-circuit comprises a fifth transistor, a first electrode of the fifth transistor is connected with a reference voltage line, a second electrode of the fifth transistor is connected with the second node, and a control electrode of the fifth transistor is connected with a second reset signal line;
the driving sub-circuit comprises a third transistor, a first electrode of the third transistor is connected with a first power terminal, a second electrode of the third transistor is connected with the third node, and a control electrode of the third transistor is connected with the first node;
the data writing sub-circuit comprises a fourth transistor, a first electrode of the fourth electrode is connected to a data line, a second electrode of the fourth electrode is connected to the second node, and a control electrode of the fourth electrode is connected to a first scan line;
the threshold compensation sub-circuit comprises a second transistor, a first electrode of the second transistor is connected with the first node, a second electrode of the second transistor is connected with the second node, and a control electrode of the second transistor is connected with a second scan line;
the first light emission control sub-circuit comprises a sixth transistor, a first electrode of the sixth transistor is connected with the third node, a second electrode of the sixth transistor is connected with a light emitting device to be driven, and a control electrode of the sixth transistor is connected with a first light emission control line;
the second light emission control sub-circuit comprises a seventh transistor, a first electrode of the seventh transistor is connected with a reference voltage line, a second electrode of the seventh transistor is connected with the second node, and a control electrode of the seventh transistor is connected with a second light emission control line;
the third reset sub-circuit comprises an eighth transistor, a first electrode of the eighth transistor is connected with a first electrode of the light emitting device to be driven, a second electrode of the eighth transistor is connected with a second initialization signal line, and a control electrode of the eighth transistor is connected with a third reset signal line;
the storage sub-circuit comprises a storage capacitor, a first terminal of the storage capacitor is connected with the second node, and a second terminal of the storage capacitor is connected with the first node; wherein
at least one of the first transistor or the second transistor comprises an oxide thin film transistor.

16. The pixel driving circuit according to claim 15, wherein switching characteristics of the first transistor, the second transistor, and the eighth transistor are the same; switching characteristics of the third transistor, the fourth transistor, the fifth transistor, the sixth transistor and the seventh transistor are the same; and the switching characteristic of the first transistor is contrary to that of the third transistor.

* * * * *